United States Patent [19]

Shibata et al.

[11] 4,172,908
[45] Oct. 30, 1979

[54] QUARTZ CRYSTAL VIBRATOR

[75] Inventors: Shin Shibata; Kikuo Oguchi, both of Suwa, Japan

[73] Assignee: Kabushiki Kaisha Suwa Seikosha, Tokyo, Japan

[21] Appl. No.: 847,352

[22] Filed: Oct. 31, 1977

Related U.S. Application Data

[62] Division of Ser. No. 737,929, Nov. 2, 1976, Pat. No. 4,099,078.

[30] Foreign Application Priority Data

Aug. 18, 1976 [JP] Japan ................... 51/98435

[51] Int. Cl.$^2$ ............... H01L 41/04; B05D 1/32
[52] U.S. Cl. ..................... 427/100; 427/124; 427/248 R; 427/250; 427/282; 427/284; 29/25.35
[58] Field of Search .......... 427/100, 282, 284, 250, 427/248 R, 124; 310/361, 370; 29/25.35

[56] References Cited

U.S. PATENT DOCUMENTS

| | | | |
|---|---|---|---|
| 2,639,392 | 5/1953 | Warner, Jr. ................... | 427/100 |
| 2,856,313 | 10/1958 | Gerber et al. ................ | 427/100 |
| 3,760,471 | 9/1973 | Börner ....................... | 427/100 |
| 3,864,161 | 2/1975 | Thompson .................... | 427/100 |
| 4,006,435 | 1/1977 | Kerbel ........................ | 427/100 |

*Primary Examiner*—Michael F. Esposito
*Attorney, Agent, or Firm*—Blum, Moscovitz, Friedman & Kaplan

[57] ABSTRACT

A flexural mode tuning fork quartz crystal vibrator having two vibrator tines including first and second opposed substantially planar surfaces, the thickness of the plate between said opposed surfaces being no greater than 0.2 mm is provided. Both surfaces of each tine have three electrodes on at least the lengthwise peripheral sides of the respective surfaces of the tines and a third electrode intermediate and not in contact with the two peripherally disposed electrodes with each intermediate electrode being short-circuited to the peripheral electrode on the other tine. A fourth electrode is disposed on at least one lengthwise side edge of both of the respective tines, the fourth electrode electrically coupling the peripherally disposed electrode on the lengthwise peripheral sides of the respective surfaces of the tine.

6 Claims, 15 Drawing Figures

QUARTZ CRYSTAL VIBRATOR

This is a division, of application Ser. No. 737,929, filed Nov. 2, 1976 now U.S. Pat. No. 4,099,078.

BACKGROUND OF THE INVENTION

This invention is directed to a flexural mode tuning fork quartz crystal vibrator, and in particular to the placement of electrodes on the sides of a quartz crystal vibrator having a thickness no greater than 0.2 mm to improve the vibratory characteristics thereof.

A recent development in manufacturing quartz crystal vibrators is the use of photo-chemical etching techniques for forming the electrodes on a quartz crystal plate. By such photo-etching techniques, the manufacturing yield has been increased while the size and price of the vibrators have been decreased. Quartz crystal vibrators utilizing such photo-etching techniques, although having reduced thickness and size, have electrodes formed on the opposed planar surfaces, only, and hence have not been able to better the performance of conventional thick quartz crystal vibrators fabricated by mechanical forming processes. Accordingly, an improved thin plate quartz crystal vibrator wherein the electrodes are formed on the opposed planar surfaces and edges is desired.

SUMMARY OF THE INVENTION

Generally speaking, in accordance with the invention, a flexural mode quartz crystal vibrator comprising a quartz crystal plate defining a tuning fork having two vibrator tines is provided. The plate is defined by first and second opposed substantially planar surfaces, both of the surfaces of each tine having three electrodes disposed on at least the lengthwise peripheral sides of the respective surfaces of the tines. A third electrode is disposed intermediate and not in contact with the two peripherally disposed electrodes, each of the intermediate electrodes being short-circuited to the peripheral electrodes on the other tine. A fourth electrode is disposed on at least one lengthwise side edge of both of the respective tines, the fourth electrodes electrically coupling the peripherally disposed electrode disposed on the opposed surfaces of each tine.

Accordingly, it is an object of this invention to improve the vibratory characteristics of a quartz crystal vibrator by having electrodes on the side of a quartz crystal vibrator plate having a thickness no greater than 0.2 mm.

Still a further object of the instant invention is to form a thin plate quartz crystal vibrator having electrodes on the opposed planar surfaces and on the side edge.

Still a further object of the instant invention is to provide a quartz crystal vibration having an electrode configuration that facilitates manufacture and assembly of the vibrator.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

DETAILED DESCRIPTION OF THE PREFERRED EMBODIMENTS

Figure 1:
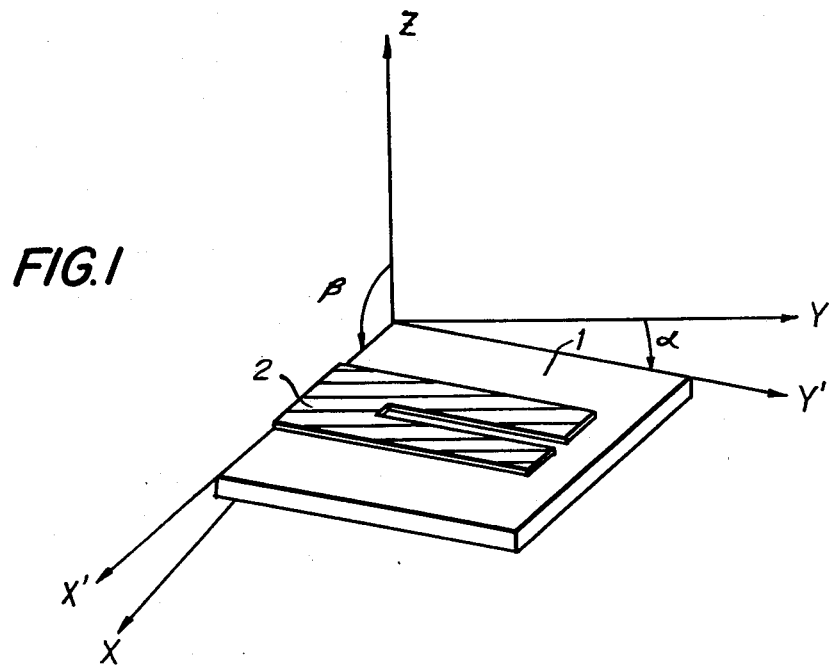
FIG. 1 is a perspective view of a quartz crystal vibrator plate constructed in accordance with the prior art.

Reference is now made to FIG. 1, wherein a tuning fork type quartz crystal vibrator 2, formed from a thin quartz crystal plate 1 having a thickness of 0.2 mm or less, is provided. The quartz crystal vibrator plate 1 is formed by rotating an X-cut plate around the X-axis by an angle $\alpha$ and further rotating same by an angle $\beta$ around the Y' axis through a rotation $\alpha$. The angle $\alpha$ is predetermined to be in the range of 0° to 10°, and the $\beta$ is predetermined to be 70° to 90° or −70° to −90°. Thereafter, the tuning fork vibrator can be formed by a chemical processing method allowing electrodes to be photo-etched thereon, thereby resulting in a small-sized extremely thin, flexural mode quartz crystal vibrator, of the type depicted in FIGS. 2 through 4.

Figure 2:
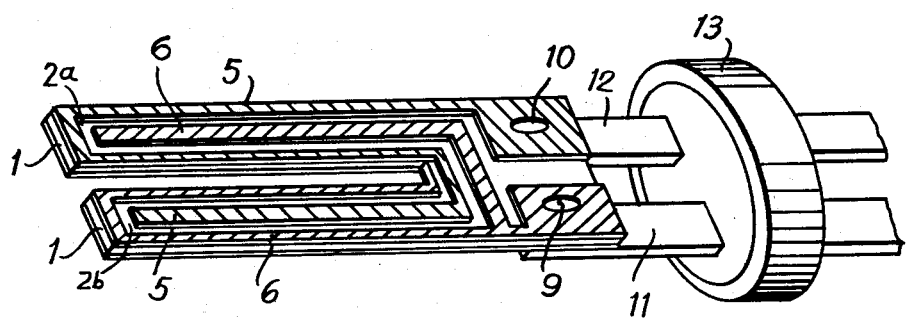
FIG. 2 is a front perspective view of a mounted quartz crystal vibrator constructed in accordance with the prior art.
Figure 3:
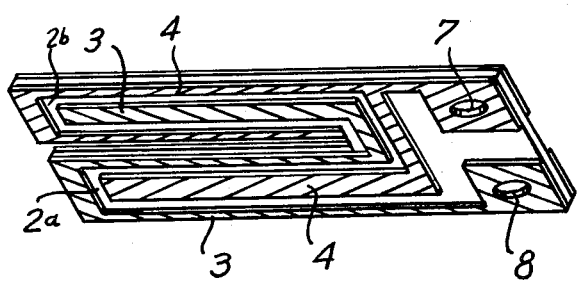
FIG. 3 is a rear perspective view of the quartz crystal vibrator depicted in FIG. 2.
Figure 4:
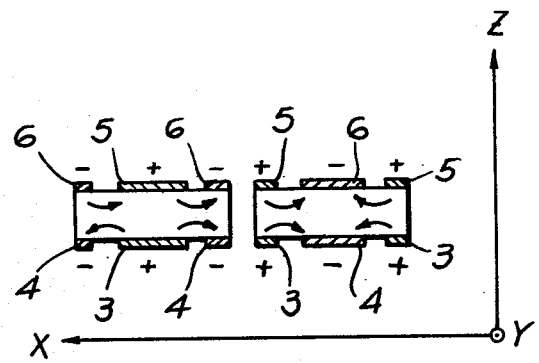
FIG. 4 is a sectional view taken through the tine of the quartz crystal vibrator depicted in FIGS. 2 and 3.

Reference is now made to FIGS. 2 through 4, wherein a thin quartz crystal plate vibrator having electrodes photo-etched thereon in a conventional manner is depicted. In order to facilitate the discussion therein, the angle $\alpha$ is set to be 0° and $\beta$ is set at 90°. The electrodes are disposed on both sides of the tuning fork quartz crystal vibrator 1, which is cut in the manner described above with respect to FIG. 1 with a thickness of no more than 0.2 mm. Electrode 5 is disposed on the peripheral sides of the top surface of the first tine 2a, along the non-vibratory portion of the tuning fork quartz crystal vibrator and on the central portion of the other tine 2b. Similarly, electrode 6 is peripherally disposed along the side edges of the front surface of the tine 2b, on the non-vibratory portion of the vibrator and along the central portion of the top surface of the tine 2a, out of contact with the peripherally disposed electrode 5 thereon. On the rear surface of the quartz crystal plate, continuous electrode 3 is disposed along the peripheral sides of the bottom surface of the tine 2a and extends onto the non-vibratory portion of the bottom surface and then onto the central portion of the vibrator tine 2d, out of contact with peripherally disposed electrode 4, which electrode is disposed on the peripheral sides of the bottom surface of the tine 2b and extends onto the non-vibratory portion and central portion of the tine 2a between and not in contact with the peripherally disposed electrode 3. On the front surface, the electrode 5 includes a mounting portion 10 extending onto the non-vibratory portion of the electrode, the mounting portion surrounding an opening in the vibrator, and the electrode 6 includes a mounting portion 9 extending onto the non-vibratory portion of the vibrator surrounding a further mounting opening disposed in the Vibrator. Similarly, electrodes 4 and 3 on the rear surface of the vibrator respectively define mounting portions 7 and 8 on the non-vibratory portion of the vibrator.

As is specifically illustrated in FIG. 2, the vibrator 2 is mounted to a hermetical mounting terminal 13, including resilient conductive leads 11 and 12, which leads in addition to resiliently supporting the vibrator, also electrically couple the electrodes on the front and rear surface of the vibrator in a conventional two-terminal coupling configuration. By forming the openings in the mounting portion, and securing the mounting pins 11 and 12 at the openings in the non-vibratory portion by injecting alloy solder or the other electrically conductive adhesives into the openings, the electrodes on the front and rear surfaces of the vibrator are coupled to each other and additionally, are coupled through the respective mounting pins 11 and 12 to the circuitry for driving same.

Accordingly, by applying an AC signal to the respective lead terminals, to thereby reference the respective electrodes to alternating but opposite polarities on each surface, stress fields are formed in the respective tines substantially parallel to the opposed planar surfaces, to thereby operate the respective quartz crystal vibrator in a flexural mode. It is noted that quartz crystal vibrators of the type depicted in FIGS. 2 through 4 permits a considerable number of vibrators to be formed at the same time by utilizing a batch fabrication process. Such a process is efficient and simple and clearly reduces the cost of manufacturing the vibrator when compared with the costs involved in mechanically producing a conventional vibrator. Moreover, vibrators of the type illustrated in FIGS. 2 through 4 are 5 mm or less in length, 1.5 mm or less in width, and as aforenoted, 0.2 mm or less in thickness thereby rendering same sufficiently small-sized as to be suitable for use in miniaturized electronic instruments, such as electronic wristwatches and the like.

Figure 5:
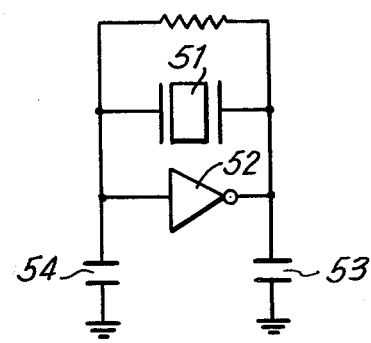
FIG. 5 is a circuit diagram of a quartz crystal oscillator circuit constructed in accordance with the prior art.
Figure 6:
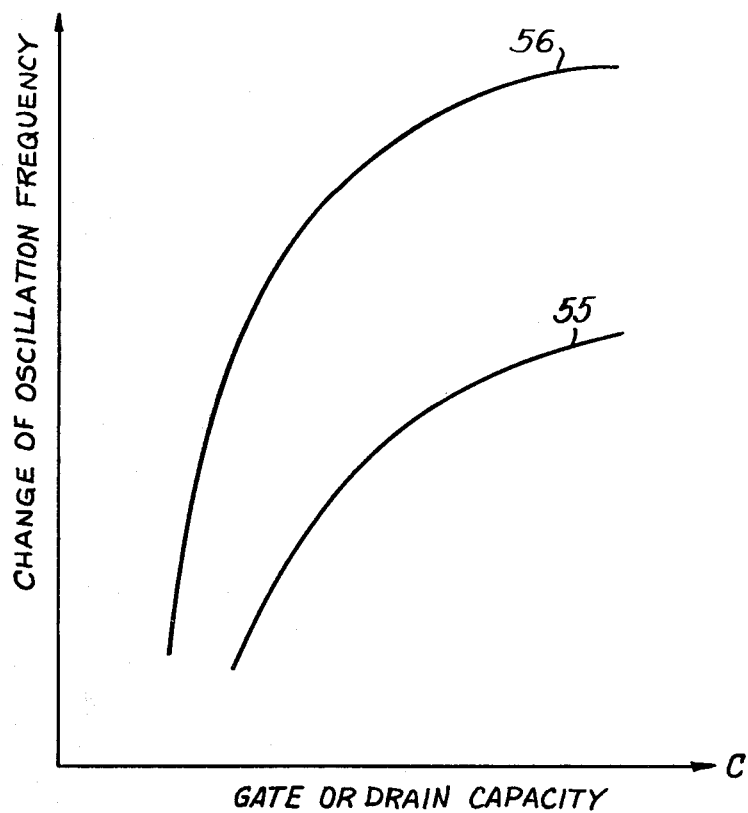
FIG. 6 is a graphical illustration of the variation in the oscillating frequency of the quartz crystal oscillator circuit in response to changes in gate and drain capacitance.

Reference is now made to FIG. 5, wherein a quartz crystal oscillator circuit including a quartz crystal vibrator 51 is depicted. The vibrator 51 is coupled in parallel with a C-MOS inverter 52 and a feedback resistor $r_f$. The C-MOS inverter is formed by a pair of complementary coupled P-channel and N-channel MOS transistors having their respective gate electrodes coupled to define an input terminal and their drain electrodes coupled to define an output terminal. A first gate capacitance 54 is coupled to the commonly coupled gate electrodes and a further drain capacitance 53 is coupled to the commonly coupled drain electrodes of the inverter 52. Referring specifically to FIG. 6, the variation in the oscillating frequency of the quartz crystal oscillator circuit in response to changes in the capacitance of the drain capacitor and/or gate capacitor are depicted. It is noted that the equivalent series capacitance of the oscillator circuit is caused in considerable part by the electrode configuration of the vibrator. The curve 55 illustrates when the equivalent series capacitance of the drain capacitor and gate capacitor is on the order of $1 \times 10^{-15}$ F., whereas the curve 56 illustrates the oscillating frequency response when the equivalent drain and gate capacitance is on the order of $2 \times 10^{-15}$ F. It is necessary for the range over which the frequency varies to be as wide as possible. Vibrators of the type illustrated and described in FIGS. 2 through 4 have a series capacitance of about $1 \times 10^{-15}$ F., and hence an increase in the series capacitance thereof would clearly improve the flexural characteristics thereof.

Figure 7:
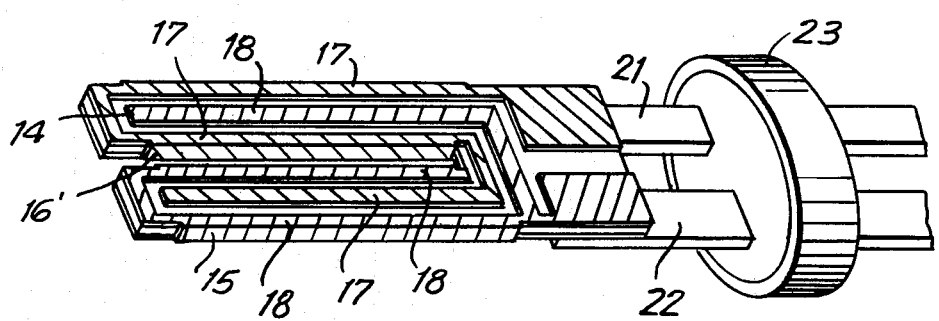
FIG. 7 is a front perspective view of a mounted quartz crystal vibrator constructed in accordance with a preferred embodiment of the instant invention.
Figure 8:
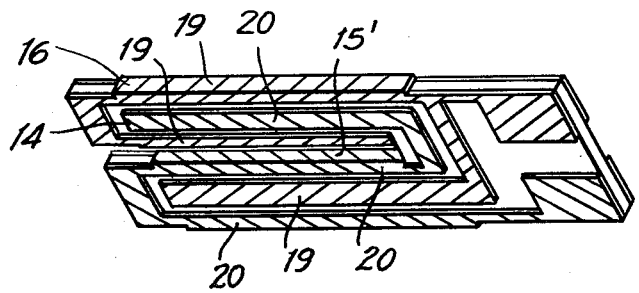
FIG. 8 is a rear perspective view of the quartz crystal vibrator depicted in FIG. 7.
Figure 9:
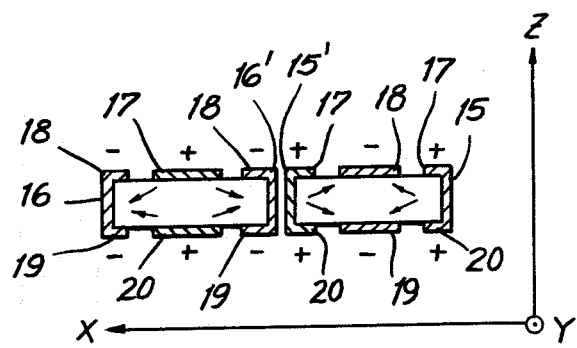
FIG. 9 is a sectional view taken through the tines of the quartz crystal vibrator depicted in FIGS. 7 and 8.

Reference is now made to FIGS. 7, 8 and 9, wherein a quartz crystal vibrator constructed in accordance with the instant invention is depicted. The quartz crystal vibrator, generally indicated as 14, includes a quartz crystal plate formed in the same manner discussed above with respect to FIGS. 2 through 4. On the front surface of the vibrator, electrode 17 is peripherally disposed around the top surface of a first tine and extends onto the central portion of the second tine and is disposed intermediate the peripherally disposed electrode 18, which electrode includes a portion extending intermediate the peripherally disposed electrodes 17 on the other tine. This pattern is repeated by electrodes 19 and 20 on the rear surface of the quartz crystal vibrator, and in this respect, the electrode configuration on the front and rear surface is identical to that illustrated and described above with respect to FIGS. 2 through 4. Additionally, side electrodes 15, 15', 16 and 16' are arranged along the lengthwise side edges of the vibrator. Electrodes 15 and 15' electrically couple the electrodes 17 disposed on the front surface of the vibrator with the electrodes 20 disposed on the rear surface of the vibrator. Similarly, side electrodes 16 and 16' couple the electrodes 18 disposed on the front surface of the vibrator with the electrodes 19 on the rear surface of the vibrator. As is particularly illustrated in FIG. 9, a greater efficiency of vibration is obtained since the electric field component in the X-axis direction is more efficiently induced by disposing electrodes on the side. Moreover, by such an arrangement, the equivalent series capacitance is doubled.

Figure 10A:
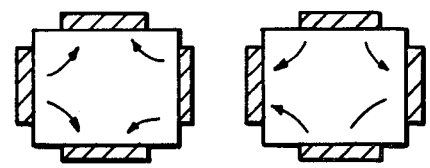
FIGS. 10a through 10e are sectional views of electrode configurations disposed on the tines of the thick and thin quartz crystal vibrators and the stress fields induced therein.

The benefits which inure to a quartz crystal vibrator wherein the electrodes are photo-etched on the sides as well as on the top and bottom surface, are demonstrated in FIGS. 10a through 10c and 10e, wherein a comparison of the distinct types of electrode configurations for thick and thin vibrators is illustrated. In FIG. 10a, a thick vibrator manufactured by a conventional mechanical process is illustrated. As is illustrated by the stress arrows, the electric field is induced between the electrodes of the upper and lower surfaces of the vibrator and the electrodes on the sides of the vibrator. The electrical characteristic of this type of vibrator is as good as any heretofore provided and accounts for this type of vibrator being the most widely used. Nevertheless, because the vibrator is a mechanically formed thick vibrator, the vibrator is increased in size, and the side electrodes make it difficult to mount such a quartz crystal vibrator.

Figure 10B:

FIG. 10b illustrates a thin vibrator having top and side electrodes. In such a case, because the width of the side electrodes is small, the efficiency of the electric fields generated is diminished, thereby providing a quartz crystal vibrator that operates at a considerable loss in efficiency when compared with the thick vibrator illustrated in FIG. 10a.

Figure 10C:

The vibrator illustrated in FIG. 10c, is of the type depicted in FIGS. 2 through 4, and does not include side electrodes but, instead, only electrodes that are disposed along the peripheral side edges of the top and bottom surfaces of the tines. Thus, as was detailed above, such a configuration is unable to obtain the efficiency of the thick film vibrator illustrated in FIG. 10a even though the size of same is reduced and the manufacturing of same is preferred.

Figure 10D:
Figure 10E:
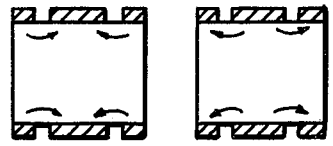

FIG. 10e, illustrates a thick vibrator having the electrode configuration depicted in FIG. 10c. The efficiency of this vibrator is clearly less than the thick vibrator depicted in FIG. 10a since the absence of side electrodes prevents the electric stress fields formed in the vibrator from being increased. Accordingly, when compared with the quartz crystal vibrator illustrated in FIGS. 10a, 10b, 10c and 10e, it is readily seen that the vibrator illustrated in FIG. 10d and FIG. 9 obtains the same type of stress fields that are obtained in a thick vibrator of the type depicted in FIG. 10a, to wit, a greater electric stress field is induced in the respective tines by the use of the side electrodes in combination with the peripherally disposed upper and lower surface electrodes. It is noted however that such an effect causes greater flexion in a thin vibrator by photo-chemical etching techniques than is possibly obtainable in a thick vibrator.

Additionally, a further benefit obtains to disposing side electrodes including edges in the manner depicted in FIGS. 7 through 9 since the side electrodes including edges effect an electrical coupling of the top and bottom electrodes, thereby rendering it unnecessary to dispose apertures in the non-vibratory portion of the plate for mounting the vibrator. It is therefore necessary to merely support the vibrator on lead wires 21 and 22, secured to the hermetical terminal 23, without having to form openings in the non-vibratory mounting portions of the electrodes, which openings require alloy solders and the like to be injected therein.

Figure 11:
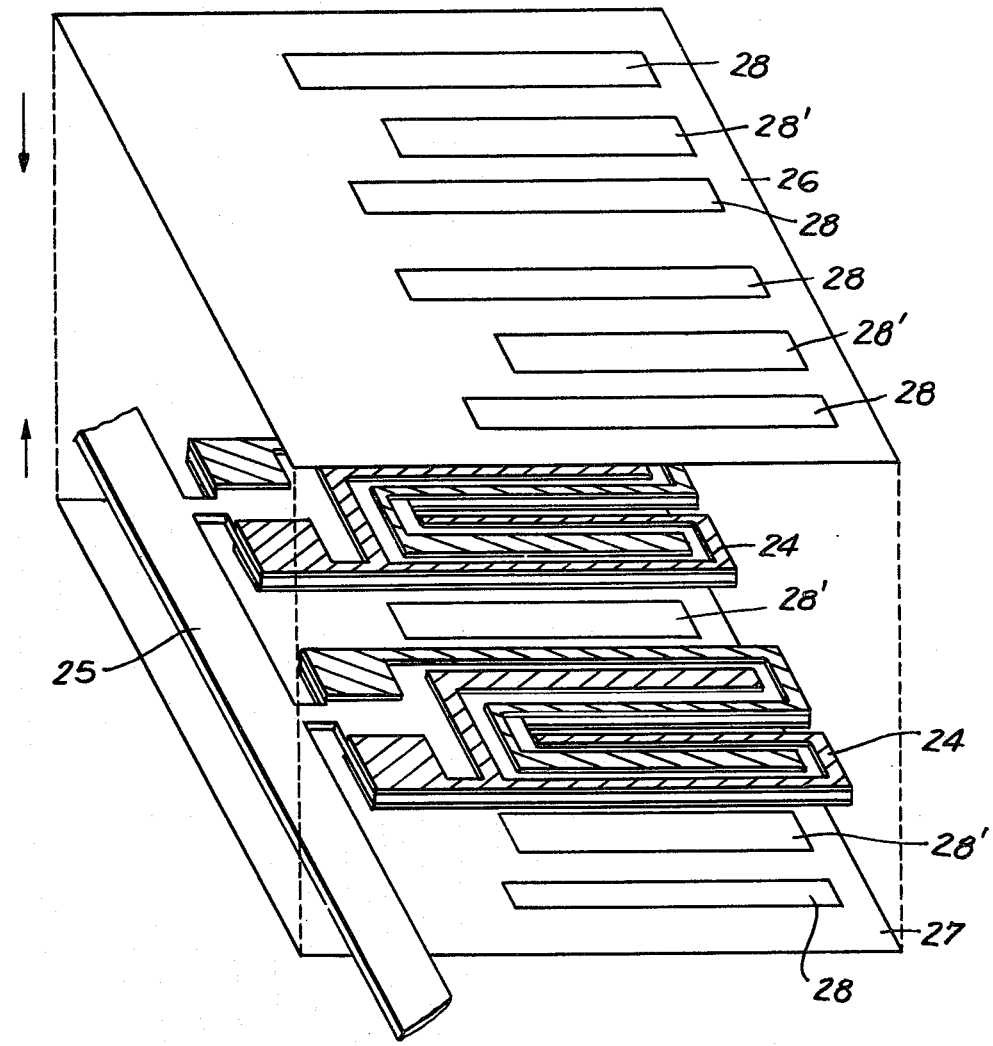
FIG. 11 is a perspective view illustrating the manner in which the improved electrode configuration of the quartz crystal vibrator is deposited thereon.

Reference is now made to FIG. 11, wherein the manner in which two quartz crystal vibrators are manufactured is depicted. The two quartz crystal vibrators 24 are coupled to a frame 25, which frame is part of the quartz crystal plate, whereafter, the electrodes on the quartz crystal plate are provided. Although FIG. 11 illustrates two vibrators extending from frame 25, in an actual fabrication, several tens of vibrators would be connected. Upper and lower masks 26 and 27 formed of metal and including openings 28 and 28' are disposed on top of and underneath the respective surfaces of the vibrator. The openings 28' in the center are made a little wider in order to permit the vacuum depositing to extend over the tines on both side edges. Accordingly, the film electrodes are deposited on the edge portions and sides of the vibrator by disposing the vibrator between the upper and lower masks and depositing the metallic film on the vibrator by vacuum evaporation. In order to insure that the sides of the vibrator are also covered, the masks should be disposed at an incline with respect to the evaporating means.

It is noted that the instant invention does not require that side electrodes be formed along the entire side edges of the vibrator. Instead, it is sufficient that the side edges along the portions of the tines that are flexurally distorted during operation be coated. Additionally, it is preferred that each of the lengthwise side edges of the vibrator plate be provided with side electrodes in order to increase the efficiency of the vibrator, although it is possible to eliminate electrodes on certain of the side edges as long as the respective top and bottom electrodes are coupled along a side edge portion of the vibrator.

It is noted that the same fabrication technique utilized in manufacturing quartz crystal vibrators having electrodes deposited on only the top and bottom surfaces of the vibrator can be utilized to manufacture quartz crystal vibrators having electrodes on the side edges, thereby providing little increase in the cost of manufacturing vibrators with side electrodes deposited thereon.

More importantly, as illustrated in FIG. 6, since the equivalent series capacitance of a quartz crystal vibrator having side photo-etched electrodes is on the order of $2 \times 10^{-15}$ F., the range over which the frequency of the vibrator varies is double that of a conventional vibrator having the electrodes only on the opposed planar surfaces. Accordingly, the range for adjustment is double that obtained in prior art quartz crystal vibrators, thereby reducing the accuracy necessary when manufacturing such vibrators, hence increasing the manufacturing yield. Moreover, the side electrodes permit a smaller-sized higher performance and more inexpensive quartz crystal vibrator, which is particularly suitable for use in electronic wristwatches.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of selectively forming a plurality of discrete electrodes on the opposed planar surfaces of a quartz crystal plate and on portions of the side edges of said quartz crystal plate to form a vibrator, comprising the steps of disposing a first mask having oversized openings therein over one planar surface of said quartz crystal plate, disposing a second mask having oversized openings therein over the other opposed planar surface of said quartz crystal plate, said enlarged openings of said first and second mask being positioned so that at least one side edge between said opposed planar surfaces remains exposed, and forming said electrodes by depositing electrode material through said openings in said first and second masks onto said opposed planar surfaces and said exposed side edge of said quartz crystal plate.

2. The method of claim 1 wherein said electrodes are formed by vacuum evaporation and deposition.

3. The method of claim 2 and further comprising the step of inclining said masks with respect to the evaporating means and the evaporator to insure deposition on said edge.

4. The method of claim 1, wherein electrodes on said opposed planar surfaces are electrically coupled by said edge electrode.

5. The method of claim 2, wherein electrodes on said opposed planar surfaces are electrically coupled by said edge electrode.

6. The method of claim 1, wherein said quartz crystal plate is shaped like a tuning fork, said side edges being side edges of the tines of said tuning fork.

* * * * *